(12) United States Patent
Marnat et al.

(10) Patent No.: US 10,452,969 B2
(45) Date of Patent: Oct. 22, 2019

(54) TREATMENT DEVICE FOR ELECTRONIC CHIPS OF AN ELONGATE ELEMENT

(71) Applicant: COMMISSARIAT A L'ENERGIE ATOMIQUE ET AUX ENERGIES ALTERNATIVES, Paris (FR)

(72) Inventors: Loïc Marnat, Grenoble (FR); Laurent Dussopt, Grenoble (FR); Dominique Vicard, Bernin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/748,351

(22) PCT Filed: Jul. 28, 2016

(86) PCT No.: PCT/EP2016/067967
§ 371 (c)(1),
(2) Date: Jan. 29, 2018

(87) PCT Pub. No.: WO2017/021264
PCT Pub. Date: Feb. 9, 2017

(65) Prior Publication Data
US 2018/0218251 A1 Aug. 2, 2018

(30) Foreign Application Priority Data
Jul. 31, 2015 (FR) ...................................... 15 57423

(51) Int. Cl.
*G06K 19/06* (2006.01)
*G06K 19/077* (2006.01)
(Continued)

(52) U.S. Cl.
CPC ... *G06K 19/07786* (2013.01); *G06K 7/10079* (2013.01); *G06K 7/10425* (2013.01); *G06K 19/0772* (2013.01); *G01R 31/2822* (2013.01)

(58) Field of Classification Search
CPC ........... G01R 31/2822; G06K 19/0772; G06K 19/07786; G06K 7/10079; G06K 7/10425
(Continued)

(56) References Cited

U.S. PATENT DOCUMENTS 4,851,018 A * 7/1989 Lazzari ................... F24F 3/161
　　　　　　　　　　　　　　　　　　　　　55/356
6,104,291 A * 8/2000 Beauvillier .......... G06K 7/0095
　　　　　　　　　　　　　　　　　　　　　340/572.1
(Continued)

FOREIGN PATENT DOCUMENTS

WO　　　　03/071476 A1　　8/2003
WO　　2013/144451 A1　10/2013

OTHER PUBLICATIONS

International Search Report and Written Opinion dated Sep. 30, 2016 issued in corresponding application No. PCT/EP2016/067967; w/ English partial translation and partial machine translation (18 pages).

(Continued)

*Primary Examiner* — Thien M Le
(74) *Attorney, Agent, or Firm* — Westerman, Hattori, Daniels & Adrian, LLP

(57) ABSTRACT

The treatment device (100) is capable of cooperating with an elongate element (1) provided with a plurality of electronic chips (2a, 2b, 2c, 2d) staggered along the length of the elongate element (1). This treatment device (100) has a housing (101) with an input orifice (102) and an output orifice (103) for the elongate element (1), and a treatment cavity (104) arranged between the input orifice (102) and the output orifice (103) and provided with a treatment probe (Continued)

(105) for electronic chip. Furthermore, the treatment device comprises an isolation system (106) configured to isolate an electronic chip to be treated present in the cavity (104) from other electronic chips of the plurality of electronic chips arranged outside of the cavity (104).

18 Claims, 5 Drawing Sheets

(51) Int. Cl.
*G06K 7/10* (2006.01)
*G01R 31/28* (2006.01)

(58) Field of Classification Search
USPC .......................................................... 235/492
See application file for complete search history.

(56) References Cited

U.S. PATENT DOCUMENTS

| | | | | |
|---|---|---|---|---|
| 6,117,756 | A * | 9/2000 | Wu | H01L 29/66825 |
| | | | | 257/321 |
| 8,902,046 | B2 * | 12/2014 | Torabi | G06K 7/10445 |
| | | | | 340/10.1 |
| 2003/0162383 | A1 * | 8/2003 | Yamaya | H01L 22/32 |
| | | | | 438/622 |
| 2005/0181530 | A1 | 8/2005 | Brugger et al. | |
| 2008/0001769 | A1 * | 1/2008 | Mayer-Zintel | G01R 31/312 |
| | | | | 340/653 |
| 2008/0100329 | A1 | 5/2008 | Nguyen et al. | |
| 2008/0205172 | A1 * | 8/2008 | Xu | G01R 31/2884 |
| | | | | 365/201 |
| 2009/0237221 | A1 | 9/2009 | Battles et al. | |
| 2013/0341303 | A1 * | 12/2013 | Kim, II | A61B 8/4411 |
| | | | | 216/38 |
| 2015/0010912 | A1 * | 1/2015 | Iqbal | G01N 33/57492 |
| | | | | 435/6.14 |
| 2015/0056918 | A1 | 2/2015 | Tuominen | |
| 2016/0027740 | A1 * | 1/2016 | Chiu | H01L 21/4853 |
| | | | | 257/659 |

OTHER PUBLICATIONS

International Preliminary Report on Patentability dated Jul. 14, 2017 issued in corresponding application No. PCT/EP2016/067967; w/ English machine translation (13 pages).

* cited by examiner

TREATMENT DEVICE FOR ELECTRONIC CHIPS OF AN ELONGATE ELEMENT

TECHNICAL FIELD OF THE INVENTION

The invention relates to the field of the treatment of electronic chips, and in particular of the testing of radio-tags, for example integrated with a wire.

The subject of the invention is, more particularly, a treatment device for an elongate element provided with a plurality of electronic chips staggered along the length of said elongate element.

STATE OF THE ART

In the field of electronics, and more particularly of radio-tags, it is common practice to fabricate communicating electronic chips, then to test them individually to ensure the correct operation thereof. These tests notably allow for a sorting with respect to the quality of the radio-tags, while allowing them to be written for the initialization thereof.

In particular, the documents US2008/0100329 and WO2013/144451 describe the use of an open cavity in which an antenna is arranged.

When a radio-tag passes over the cavity, it cooperates with the antenna of a test system arranged in the bottom of the cavity.

The result thereof is an issue in testing at high rate. In effect, in this case, the radio-tags are relatively close to one another, so the testing of a radio-tag, in particular by the antenna arranged in the cavity, risks disturbing the adjacent radio-tags. In this regard, the document US2008/0100329 proposes earthing the untested radio-tags. This solution is complex to implement in as much as it necessitates providing for the grounding of all the radio-tags within range of the antenna.

For its part, the document WO2013/144451 proposes using a capacitive coupler that makes it possible to minimize the external influences. In this regard, this solution, which proposes a simple minimization of the influences, requires improvement.

OBJECT OF THE INVENTION

The aim of the present invention is to propose a solution which remedies the drawbacks listed above.

This aim is targeted by a treatment device capable of cooperating with an elongate element provided with a plurality of electronic chips staggered along the length of said elongate element, said treatment device comprising a housing comprising:
  an input orifice for the elongate element,
  an output orifice for the elongate element,
  a treatment cavity arranged between the input orifice and the output orifice and provided with a treatment probe for electronic chips,
and the treatment device comprising an isolation system configured to isolate an electronic chip to be treated present in the cavity from other electronic chips of the plurality of electronic chips arranged outside the cavity.

In particular, the treatment probe comprises a radiofrequency antenna configured to interact with the electronic chip to be treated forming a chip of a radio-tag.

Advantageously, the antenna is chosen from among:
  a dipole antenna,
  an antenna with single slot of which said single slot extends along a section of the elongate element present in the cavity of the housing when the elongate element passes through the input orifice and the output orifice,
  an antenna with double slots of which a first slot extends along a section of the elongate element present in the cavity of the housing when the elongate element passes through the input orifice and the output orifice, and of which a second slot is substantially at right angles to the first slot, said first and second slots being included in one and the same plane and comprising a common part at their intersection,
  a loop antenna.

According to one embodiment, the isolation system comprises a first ferrite arranged at the input orifice and a second ferrite arranged at the output orifice.

Alternatively or in combination with the ferrites, the isolation system can comprise short-circuiting elements configured so as to come into physical contact with the elongate element on either side of a chip to be treated placed in the cavity.

The invention also relates to an installation comprising a treatment device as described, an elongate element comprising a plurality of electronic chips staggered along the length of said elongate element, a system for driving the elongate element to run it through the housing of the treatment device through the input and output orifices, the installation comprising a treatment configuration in which an electronic chip to be treated of the elongate element is present in the cavity of the housing and in which two electronic chips adjacent to the electronic chip to be treated are arranged outside of the housing.

In particular, in the treatment configuration, the two electronic chips adjacent to the electronic chip to be treated are linked electrically to the chip to be treated by link elements of the elongate element, and the isolation system is configured to act on the electromagnetic waves from the treatment probe that are propagated along said link elements linked to said electronic chip to be treated.

In particular, in the treatment configuration, said link elements each pass through a ferrite.

The link elements can be in physical contact with short-circuiting elements of the isolation system.

The invention also relates to a method for using a device as described, comprising:
  a step of provision of an elongate element comprising a plurality of electronic chips staggered along the length of said elongate element,
  a step of placement of one of the chips of the plurality of electronic chips in the cavity of the treatment device such that two other electronic chips adjacent to the electronic chip placed in the cavity are arranged outside of the housing,
  a step of activation of the treatment probe to treat said electronic chip placed in the cavity with the result that the treatment probe interacts with the electronic chip placed in the cavity.

Preferentially, the electronic chip placed in the cavity and the two adjacent electronic chips placed outside of the housing during the step of placement are electronic chips of radio-tags, and the electronic chip placed in the cavity is linked electrically to one of the adjacent electronic chips by a first electrical link element, and to the other of the adjacent electronic chips by a second electrical link element, the first and second electrical link elements forming an antenna of the electronic chip placed in the cavity, and the method comprises a step of interaction of the isolation system with the first and second electrical link elements making it possible to filter, or short-circuit, electromagnetic waves that are propagated along the first and second electrical link elements following the activation of the treatment probe to avoid electrically powering said two adjacent electronic chips by said electromagnetic waves.

BRIEF DESCRIPTION OF THE DRAWINGS

Other advantages and features will emerge more clearly from the following description of particular embodiments of the invention given as nonlimiting examples and represented in the attached drawings, in which.

DESCRIPTION OF PREFERENTIAL EMBODIMENTS OF THE INVENTION

The present invention differs from the prior art in particular in that it proposes using a housing that makes it possible to isolate and treat/test an electronic chip individually, for example by acting on the containment of the waves emitted by a treatment probe in the exemplary radio-tag chip.

Although the present invention is preferentially applicable to the field of the treatment of radio-tags, in particular the testing thereof, the chip to be treated by the treatment device can be of another type such as a light-emitting diode or a photovoltaic cell.

Figure 1:
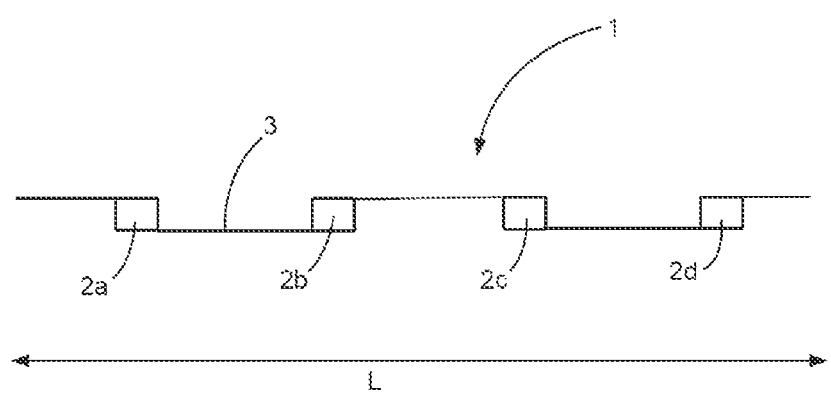
FIG. 1 illustrates a first type of elongate element.
Figure 2:
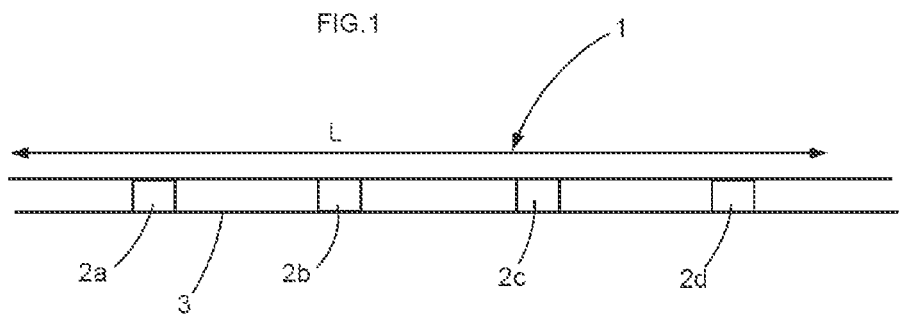
FIG. 2 illustrates a second type of elongate element.

In the present description, as illustrated in FIGS. 1 and 2, an elongate element 1 comprises a plurality of electronic chips 2a, 2b, 2c, 2d staggered along the length L of said elongate element 1. Link elements 3 of the elongate element 1 make it possible to mechanically link the electronic chips 2a, 2b, 2c, 2d two by two.

Typically, except for the two electronic chips 2a, 2d of the plurality of electronic chips 2a, 2b, 2c, 2d situated at the opposing longitudinal ends of the elongate element 1, each electronic chip 2b, 2c is framed by two other adjacent electronic chips respectively called preceding electronic chip and following electronic chip. For example, the framed electronic chip 2b is linked to the preceding electronic chip 2a by a first link element and to the following electronic chip 2c by a second link element.

Thus, in the present description, "electronic chip adjacent to another electronic chip" should be understood to mean an electronic chip which is situated directly alongside another electronic chip without the interposition of an intermediate electronic chip.

In the present description, a chip or a chip to be treated is an electronic chip.

In the example of FIG. 1, the electronic chips 2a, 2b, 2c, 2d form three pairs of adjacent electronic chips (2a, 2b) (2b, 2c) (2c, 2d) and the electronic chips of each pair of adjacent electronic chips are linked by a single link element which is associated with them.

In the example of FIG. 2, the electronic chips 2a, 2b, 2c, 2d form three pairs of adjacent electronic chips (2a, 2b) (2b, 2c) (2c, 2d) and the electronic chips of each pair of adjacent electronic chips are linked by two link elements 3 which are associated with them.

In the example of FIG. 2, the electronic chips can be held between two wires whose sections are formed by link elements.

In particular, the elongate element 1 of FIG. 2 can be an intermediate product that makes it possible to obtain the elongate element 1 according to FIG. 1. In this case, it will be understood that some sections of the two wires will be able to be cut appropriately.

The link elements make it possible to mechanically link the electronic chips to one another for the elongate element to form a festoon of electronic chips.

According to a particular implementation, the link elements 3 are wholly or partly electrically conductive, and each electronic chip 2a, 2b, 2c, 2d of the plurality of electronic chips is connected electrically to at least two link elements, in particular extending on either side of said electronic chip along the length of the elongate element, to form a radio-tag. In other words, each electronic chip of the plurality of electronic chips can be a chip of a radio-tag whose antenna is formed by at least two electrically conductive link elements. "Electrically conductive link element" should be understood to mean that the link element can comprise an electrically conductive core covered or not by an insulator. Thus, in addition to the mechanical link between the electronic chips of the elongate element 1, the link elements also make it possible to link the electronic chips electrically to one another.

A radio-tag, or RFID (radiofrequency identification) tag, is generally used to store or retrieve data remotely. For example, a radio-tag makes it possible to identify objects or even people carrying an object associated with a radio-tag. A reader within the meaning of the present description makes it possible to write and/or read radio-tag information.

In particular, the radio-tags of the elongate element are of UHF (ultra high frequency) type, that is to say with a bandwidth that can lie between 860 MHz and 960 MHz.

In the example in which the electronic chips are radio-tag chips, the electronic chips can be spaced apart by a few centimeters, typically between 8 cm and 16 cm. This spacing distance is proportional to a quarter or half wavelength of the radio-tags.

Figure 3:
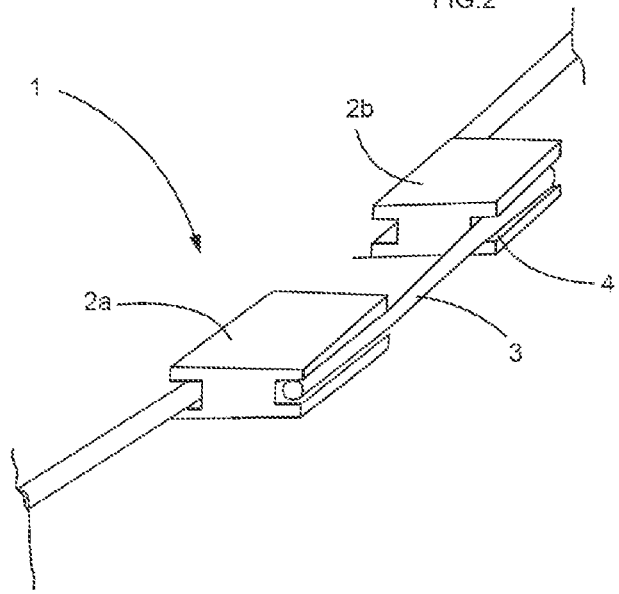
FIG. 3 illustrates in more detail the integration of the electronic chips in the elongate element of the type of FIG. 1.

FIG. 3 shows an example of the incorporation of the electronic chips in the elongate element 1 that is applicable to different embodiments of the elongate element 1. Here, the electronic chips 2a, 2b comprise a support provided with at least one groove 4 for longitudinally embedding an associated link element. FIG. 3 shows that each electronic chip comprises at least two embedding grooves 4 and in each embedding groove 4 a corresponding link element 3 is embedded. This principle can also be used to form the elongate element according to FIG. 2 in as much as each electronic chip then embeds the two wires in two corresponding longitudinal embedding grooves.

Figure 4:
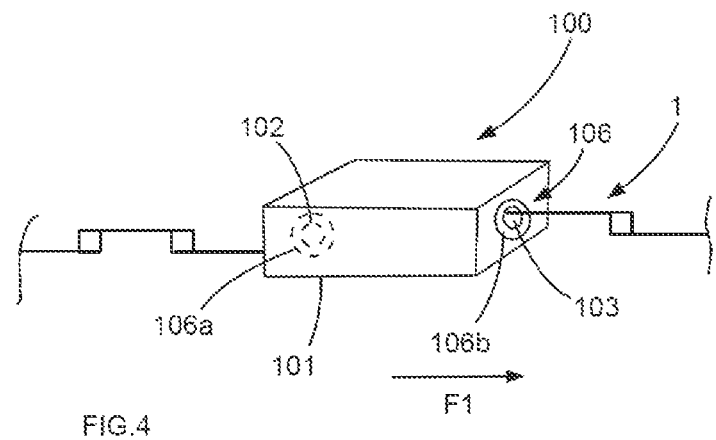
FIG. 4 illustrates a perspective view of a treatment device according to a particular implementation of the invention.
Figure 5:
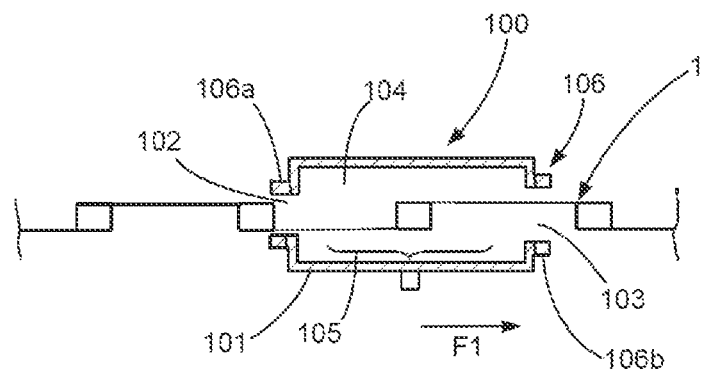
FIG. 5 is a cross-sectional view of the housing of FIG. 4 in an embodiment in which the isolation system is ferrite-based.
Figure 6:
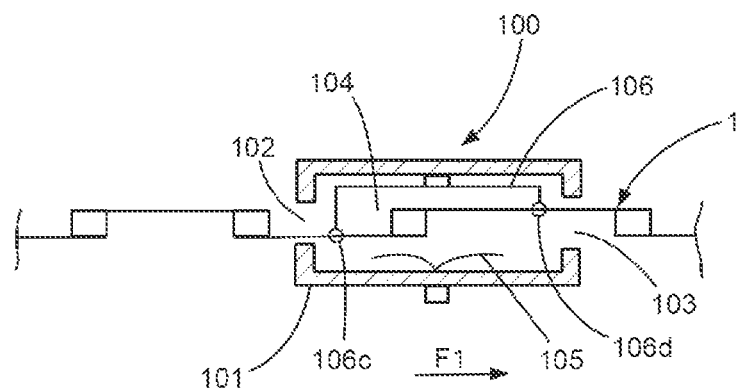
FIG. 6 is a cross-sectional view of a housing of the type of FIG. 4 in a variant in which the isolation system is based on short-circuit elements.

FIGS. 4 to 6 illustrate a treatment device 100 capable of cooperating with the elongate element described previously. This treatment device 100 comprises a housing 101 comprising an input orifice 102 for the elongate element 1 and an output orifice 103 for the elongate element 1. It will then be understood that the housing 100 is configured so as to allow within it the elongate element 1 to run in a direction oriented by the arrow F1.

Furthermore, the treatment device comprises a treatment cavity 104 arranged between the input orifice 102 and the output orifice 103 and provided with a treatment probe 105 for electronic chips. In other words, the treatment probe 105 is placed in the cavity 104. The input orifice 102 allows an electronic chip of the elongate element 1 to enter into the cavity and the output orifice 103 allows said chip to be extracted after its treatment in the cavity 104. In other words, the input and output orifices 102, 103 connect the cavity 104 of the housing 101 with the outside of the housing 101. It will then be understood that the cavity 104 is internal to the housing 101. Notwithstanding the input and output orifices which allow the connection of the interior of the cavity 104 with the outside of the housing 101, the cavity 104 is a closed cavity.

Finally, the treatment device 100, preferentially the housing 101 of the treatment device 100, comprises an isolation system 106 configured to isolate an electronic chip to be treated present in the cavity 104 from other electronic chips of the plurality of electronic chips arranged outside of the cavity 104.

More particularly, the isolation system 106 makes it possible to avoid having the treatment probe 105 able to interact with the electronic chips situated outside of the housing 101, or with the environment outside the housing 101.

According to one example, the electronic chips are light-emitting diodes, or photovoltaic cells, and the housing combined with the isolation system makes it possible to best treat (in particular test) said electronic chips individually without the environment outside the housing influencing, if appropriate, the treated electronic chip or the treatment probe.

According to a preferred embodiment mentioned previously, the chips of the plurality of electronic chips are radio-tag chips. In this regard, the treatment probe 105 comprises a radiofrequency antenna configured to interact with the electronic chip to be treated (that is to say an electronic chip present in the cavity of the housing) forming a chip of a radio-tag. In this case, the housing 101 can be formed in such a way as to contain the electromagnetic waves generated by the antenna of the treatment probe 105 within the housing 101 to avoid having these waves reach the chips of the elongate element 1 situated outside of the housing 101 and provoking the electrical activation/powering thereof.

When the electronic chips of the elongate element form radio-tag chips, the treatment probe 105 is linked in particular to a radio-tag reader. Such a reader for treating, testing and/or writing and/or reading radio-tags is well known to the person skilled in the art and will not be described here.

The isolation system 106 can also participate in avoiding or in limiting the propagation of the waves from the treatment probe 105 out of the housing 101. This is particularly the case when the housing 101 is used to treat an elongate element 1 comprising a plurality of radio-tags each formed by a corresponding electronic chip and by an antenna formed from the link elements electrically linking two adjacent electronic chips of the elongate element. It will be understood here that when a chip to be treated is present in the cavity, the treatment probe 105 will also interact by wave coupling with the link elements which then risk propagating the waves out of the housing 101 via the input and output orifices 102, 103. The presence of the isolation system 106 makes it possible to stop (or to limit) this propagation from the link elements.

In this respect, the isolation system 106 can comprise (FIGS. 4 and 5) a first ferrite 106a arranged at the input orifice 102 and a second ferrite 106b arranged at the output orifice 103. These ferrites 106a, 106b then make it possible to contain the waves in the housing 101 and prevent the latter from reaching the electronic chips situated outside of the housing 101. "At the input orifice" should be understood to mean that the first ferrite 106a can be placed outside the cavity 104 as can be seen in FIG. 5, but that, alternatively, the first ferrite 106a can be placed inside the cavity 104. "At the output orifice" should be understood to mean that the second ferrite 106b can be placed outside the cavity 104 as can be seen in FIG. 5, but that, alternatively, the second ferrite 106b can be placed inside the cavity 104. For example, the ferrites 106a, 106b form an attenuation filter for the waves that are propagated in the link elements following the activation of the treatment probe 105 to lower the levels of the waves that are propagated in the link elements to levels incapable of activating a radio-tag outside of the housing 101. In particular, each of the first and second ferrites 106a, 106b comprises an opening, and is passed through by the elongate element. The opening of the ferrites 106a, 106b is therefore situated in the extension respectively of the input and output orifices 102, 103. The advantage of using an isolation system 106 based on ferrites is that the isolation system 106 does not have to come into contact with the elongate element 1 to perform its filter function, with the result that the rate of treatment can be increased. The person skilled in the art will be able to choose the appropriate ferrites based on the knowledge of the characteristics of the radio-tags and of the transmission power of the treatment probe. In effect, the materials forming the ferrites are characterized by a permeability (denoted $\mu$) greater than 1. These materials concentrate the magnetic field and are often used either to attenuate currents conducted on a power supply cable, or to couple energy (transformer). According to a particular example suited to the application of a particular embodiment of the present invention, the ferrites are chosen on the basis of the manufacturer data presenting the impedance as a function of the frequency, and here, ferrites with a resistance of approximately 1000 ohms at 1 GHz will preferentially be chosen.

The isolation system 106 based on ferrites 106a, 106b is most particularly suited to an elongate element of the type of FIG. 1 and allows an isolation without contact with the elongate element 1 as it runs through the housing 101.

Advantageously, the distance between the ferrite and the festoon is small, preferably less than or equal to 5 mm. Furthermore, it is also advantageous for the ferrite to extend over a significant length along the festoon, preferably over a length greater than or equal to 10 mm.

FIG. 6 illustrates another implementation of the isolation system 106. Here, the isolation system 106 makes it possible to produce a short-circuiting of the link elements on either side of the electronic chip to be treated in order to contain the waves emitted by the treatment probe 105 and coupled to the link elements in the cavity 104. In other words, the isolation system 106 can comprise short-circuiting elements 106c, 106d configured so as to come into physical contact with the elongate element 1 on either side of a chip to be treated placed in the cavity 104. The short-circuiting elements can be arranged at the input and output orifices of the housing 101. According to one example, the short-circuiting elements 106c, 106d comprise connection terminals formed in the input orifice and the output orifice, in which case, the elongate element 1 can be stressed against said connection terminals when a chip to be treated is present in the cavity 104 or while the elongate element 1 is running through the housing 101. According to one embodiment, the short-circuiting elements can be implemented by two guiding rollers in contact with the elongate element on either side of the chip to be treated when the latter is arranged in the cavity of the housing, and in particular these rollers can guide the elongate element 1 when it passes through the cavity. According to yet another embodiment, the short-circuiting elements can be implemented by brushes of antistatic type arranged respectively at the input and output orifices of the housing so as to touch the elongate element on either side of the chip to be treated when the latter is arranged in the cavity.

The embodiment of FIG. 6 is most particularly suited to the elongate element 1 of FIG. 2, although it is also functional with the embodiment of FIG. 1. In fact, in the context of an elongate element 1 according to FIG. 2, the electromagnetic field is contained between two link elements that are parallel and placed facing one another which means that the ferrite is insufficient. The short-circuiting then makes it possible to control the propagation of the electromagnetic wave by preventing it from being propagated to the electronic chips that are adjacent to the electronic chip currently being treated and that are arranged outside the housing 1.

Figure 7:
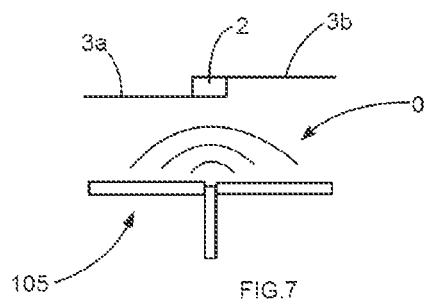
FIG. 7 illustrates a particular embodiment in which the treatment probe comprises a dipole antenna.

According to one implementation, when the treatment probe 105 is intended to cooperate with a radio-tag whose chip 2 is linked electrically to only two electrically conductive link elements 3a, 3b, the treatment probe 105 can comprise an antenna in the form of a simple dipole (dipole antenna) as shown in FIG. 7. In this case, the waves O generated by the antenna are propagated to the radio-tag in a known manner.

Figure 8:
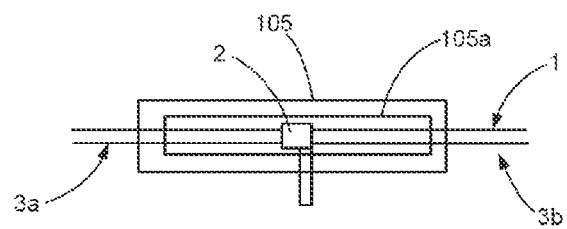
FIG. 8 illustrates a particular embodiment in which the treatment probe is a single-slot antenna.

When the radio-tag is incorporated in an elongate element according to FIG. 2, the treatment probe 105 advantageously comprises an antenna (FIG. 8) comprising a slot 105a parallel to the elongate element 1 when an electronic chip 2 has to be treated. This allows the antenna 105 to be coupled with two couples of parallel link elements 3a, 3b linked on either side to the chip 2 of the radio-tag to be treated.

Figure 9:
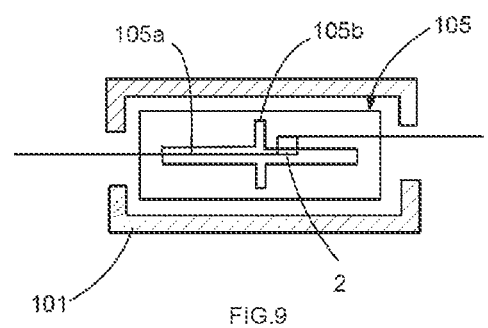
FIG. 9 illustrates a particular embodiment in which the treatment probe is a double-slot antenna.

Alternatively, as illustrated in FIG. 9, for the treatment probe 105 to be able to be compatible both with the elongate element 1 of FIG. 1 and the elongate element 1 of FIG. 2, said treatment probe 105 can comprise an antenna with double slots 105a, 105b that are substantially at right angles, of which one of the slots is substantially parallel to the elongate element when it runs through the housing 101 (compatibility with the elongate element 1 of the type of FIG. 2) and the other of the slots is substantially at right angles to the elongate element when it runs through the housing 101 (compatibility with the elongate element of the type of FIG. 1). In this case, the two slots 105a, 105b have a common part at their intersection and a reader can be linked to the two slots at their intersection.

Figure 13:
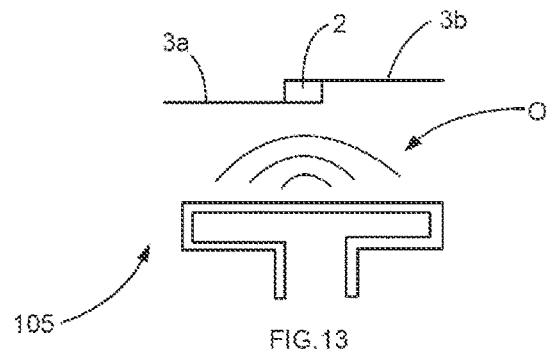
FIG. 13 illustrates yet another particular embodiment in which the treatment probe is a loop antenna.

In other words, the antenna of the treatment probe can be chosen from among:
  a dipole antenna 105,
  an antenna 105 with single slot 105a of which said single slot extends along a section of the elongate element 1 present in the cavity 104 of the housing 101 when the elongate element 1 passes through the input orifice 102 and the output orifice 103,
  an antenna 105 with double slots 105a, 105b of which a first slot 105a extends along a section of the elongate element 1 present in the cavity 104 of the housing 101 when the elongate element 1 passes through the input orifice 102 and the output orifice 103, and of which a second slot 105b is substantially at right angles to the first slot 105a, said first and second slots 105a, 105b being included in one and the same plane and comprising a common part at their intersection. A reader can be linked to said slots at their intersection,
  a loop antenna 105 as illustrated in FIG. 13 and using the same references as FIG. 7.

This list of antennas of the treatment probe can be added to according to the use of the treatment device.

Figure 10:
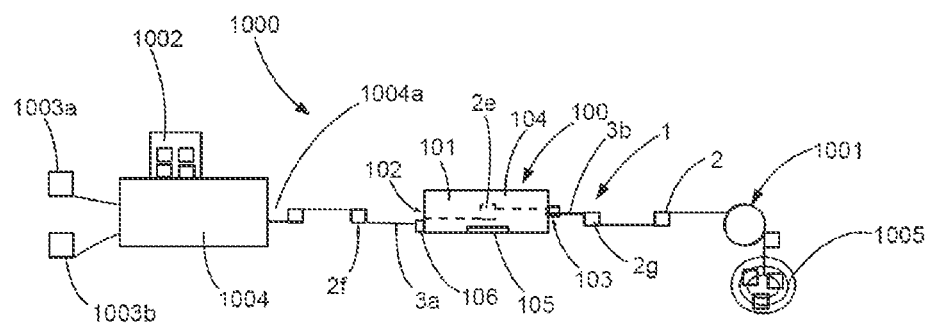
FIG. 10 illustrates a particular example of an installation comprising a treatment device according to a particular implementation of the invention.

The invention also relates to an installation 1000 that can be seen in FIG. 10 and comprising a treatment device 100 as described and the elongate element 1 comprising the plurality of electronic chips 2 staggered along the length of said elongate element 1. The installation further comprises a system 1001 for driving the elongate element 1 to run it through the housing 101 of the treatment device through the input and output orifices 102, 103. The driving system 1001 can make it possible to successively bring the electronic chips of the elongate element 1 into the cavity for them to be treated therein. The installation 1000 comprises a treatment configuration in which an electronic chip to be treated 2e of the elongate element 1 is present in the cavity 104 of the housing 101 and in which two electronic chips 2f, 2g adjacent to the electronic chip to be treated 2e are arranged outside of the housing 101.

In the treatment configuration, the two electronic chips 2f, 2g adjacent to the electronic chip to be treated 2e can be linked electrically to the chip to be treated 2e by link elements 3a, 3b of the elongate element 1, and the isolation system 106 is configured to act on the electromagnetic waves from the treatment probe 105 that are propagated along the link elements 3a, 3b linked to said electronic chip 2e to be treated. In this case, the electronic chips to be treated and that are adjacent can be radio-tag chips and the link elements 3a, 3b can be antennas of the radio-tag to be treated and antennas of the two adjacent chips.

Advantageously, in the treatment configuration, said link elements 3a, 3b (extending on either side of the chip to be treated 2e) each pass through a ferrite. Thus, the ferrites make it possible to filter the waves from the treatment probe that are propagated along the link elements 3a, 3b toward the two adjacent electronic chips in order to not provoke the activation or the electrical powering thereof.

Alternatively or in combination with the use of ferrites, said link elements 3a, 3b can be in physical contact with short-circuiting elements of the isolation system 106, in particular as described previously. This short-circuiting provokes the effects already described hereinabove.

Moreover, the installation can also comprise a reservoir 1002 of electronic chips as well as two spools 1003a, 1003b of wires linked to an assembly machine 1004 making it possible to supply, at its output 1004a, the elongate element 1 as described previously. For example, for that, the installation can comprise a device for assembling electronic chips on a wire as described in the document EP2390194.

Finally, after the housing 101, the installation 1000 can comprise a winding system 1005 for the elongate element 1.

Furthermore, the invention also relates to a method for using a treatment device as described. Such a method comprises: a step of provision of an elongate element 1 comprising a plurality of electronic chips staggered along the length of said elongate element 1; a step of placement of one 2e of the electronic chips of the plurality of electronic chips in the cavity 104 of the treatment device 101 such that two other electronic chips 2f, 2g adjacent to the electronic chip 2e (the electronic chip to be treated) placed in the cavity 104 are arranged outside of the housing 101; a step of activation of the treatment probe 105 to treat said electronic chip 2e placed in the cavity 104 with the result that the treatment probe 105 interacts with the electronic chip 2e placed in the cavity 104.

In particular, it can follow from what has been stated previously in relation to the description of the installation that the electronic chip 2e placed in the cavity 104 and the two adjacent electronic chips 2f, 2g placed outside of the housing 101 during the step of placement are radio-tag electronic chips. In this case, the electronic chip 2e placed in the cavity 104 is linked electrically to one of the adjacent electronic chips 2f by a first electrical link element 3a, and to the other of the adjacent electronic chips 2g by a second electrical link element 3b, the first and second electrical link elements 3a, 3b forming an antenna of the electronic chip 2e placed in the cavity 104. Thus in this particular case, the method comprises a step of interaction of the isolation system 106 with the first and second link elements 3a, 3b making it possible to filter, or short-circuit, electromagnetic waves that are propagated along the first and second link elements 3a, 3b following the activation of the treatment probe 105 to avoid the electrical powering of said two adjacent electronic chips 2f, 2g by said electromagnetic waves.

As described previously, the housing 101 (and in particular the cavity 104) can be arranged to contain the waves emitted by the treatment probe 105.

Generally, the housing is shielded and can adopt a rectangular form that is elongated in the direction in which the elongate element runs between the input orifice 102 and the output orifice 103. In the example of FIGS. 4 to 6, the housing 101 is metal and adopts the following dimensions: 11×4×4 cm$^3$. Generally, the dimensions of the housing 101 and in particular of the cavity 104 will be adapted according to the treatment probe 105 and the type of chips to be treated.

Preferably, in the application according to which the electronic chips of the elongate element are radio-tag electronic chips, the treatment probe 105 is arranged in the cavity 104 of the housing 101 such that the antenna of the treatment probe 105 is remote from an electronic chip to be treated present in the housing 101 by a distance lying between a few millimeters and ten or so centimeters for the case of the elongate element 1 according to FIG. 1. For the elongate element 1 according to FIG. 2, this distance separating the antenna of the treatment probe from the electronic chip to be treated is a few millimeters (for example 2 mm), lying in particular between 0.1 and 5 mm.

It will be understood from the present description that the treatment device can advantageously be used when the elongate element comprises:

- radio-tags, or communication devices, using interconnected wired UHF links,
- radio-tags, or communication devices, using wired UHF links that are not interconnected but arranged at a close distance along a wire/cable/cord,
- radio-tags printed on a tag and connected electrically together.

Furthermore, the treatment device can also make it possible to write data in radio-tag electronic chips thus making it possible to functionalize them on demand. The concept of treatment should be taken in the broad sense in as much as it can make it possible to check the functionality of a radio-tag/to write or read data on the radio-tag to functionalize it independently, enter data on a memory of the chip, dialog with the chip, etc. In effect, a use according to a general treatment function has been described above in relation to the device, the installation and the method. Preferably, a test function can be considered which allows an interaction with a chip to test it for example. In this regard, in the present description in relation to the invention, the occurrences of the word "treatment" can be replaced by the word "test", the occurrences of the verb "to treat" by the verb "to test" and the occurrences of the term "treated" by the term "tested".

Generally, a reader can be linked to the treatment probe (in particular to the antenna of the treatment probe) to allow the emission of electromagnetic waves by said treatment probe in the cavity 104 of the housing 101. In the present description, the use of the term "waves" on its own refers in particular to these electromagnetic waves.

Figure 11:
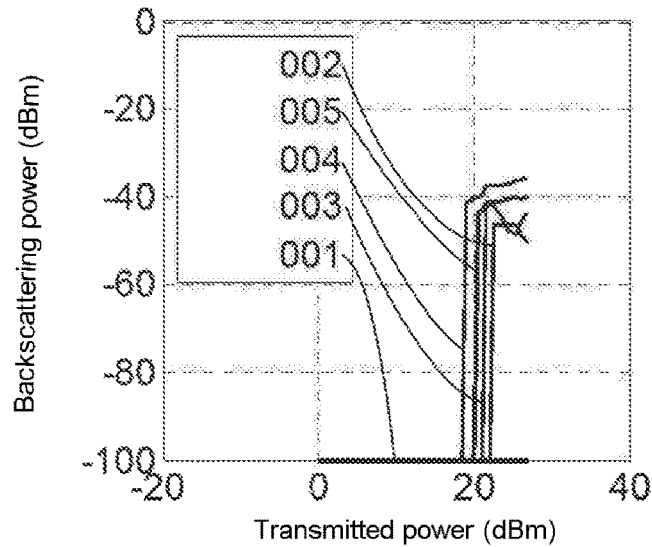
FIG. 11 illustrates the backscattering power as a function of the transmitted power for a radio-tag treatment probe without the use of the treatment housing.
Figure 12:
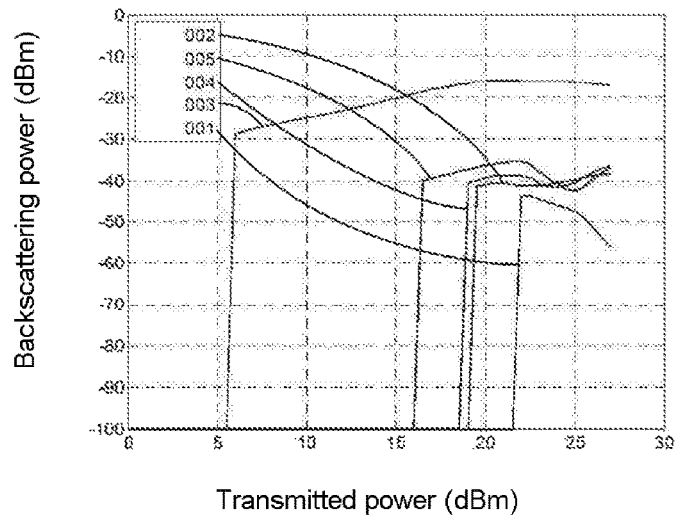
FIG. 12 illustrates the backscattering power as a function of the transmitted power for a radio-tag treatment probe with the use of the treatment housing.

FIG. 11 illustrates the backscattering power as a function of the power transmitted by the antenna for a test carried out on a radio-tag identified 003 of the elongate element without the use of the treatment device. The elongate element also comprises, in succession, the radio-tags 001, 002, 003, 004, 005 whose response curves are also represented in FIG. 11. It can be seen that the wave from the treatment probe is not contained in the housing, and requires a transmission power of approximately 20 dBm. It is clear from the analysis of FIG. 11 that the test of the radio-tag 003 also provokes the activation of the other radio-tags. For comparison, FIG. 12 illustrates the backscattering power as a function of the power transmitted by the antenna for the use of the treatment device whose isolation system comprises the ferrites, and for which the radio-tag 003 is present in the cavity of the housing while the other radio-tags 001, 002, 004, 005 are situated outside of the housing. It clearly emerges from the analysis of FIG. 12 that the control of the power of the treatment probe makes it possible to ensure that only the radio-tag 003 will be addressed by the treatment probe. Moreover, it can also be seen that the power needed to activate a radio-tag with the use of the housing is less than the power without housing, which is due to the fact that the waves are contained in the cavity. Thus, generally, the inner faces of the cavity 4 can be reflective to the waves emitted by the treatment probe, this being able to be implemented when the housing is formed by a metal. In this regard, the treatment device as described makes it possible to use a wide range of emission power for the reader linked to the treatment probe while having a lesser sensitivity of the reflected energy with a greater difference in power re-radiated between the radio-tag under test (003 in the example) and the other radio-tags outside of the housing (001, 002, 004, 005 in the example).

Thus, it will be understood from the present description that the housing can be configured so as to contain, or limit, the propagation of the waves generated by the treatment probe out of the housing (particularly in the context of radio-tag testing). For that, the cavity formed by the housing makes it possible to avoid a propagation of the waves directly emitted by the treatment probe out of the housing. The term "shielded housing" is used in particular for this containment function. Consequently, the housing can be formed in a metal and its characteristics can be chosen by the person skilled in the art so as to ensure its function. Furthermore, the emission of the waves by the treatment probe results in a coupling of said waves to the elongate element (in particular to the electrically conductive link elements) within the cavity and the isolation system makes it possible to prevent or limit the propagation of said waves coupled to the elongate element outside of the housing.

Figure 14:
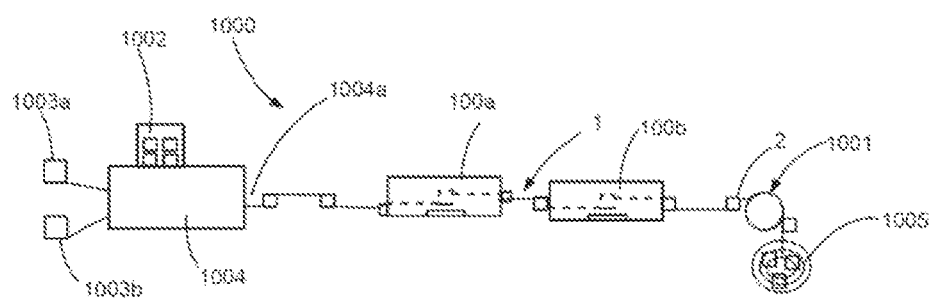
FIG. 14 illustrates a variant of FIG. 10 in as much as the installation comprises two treatment devices.

According to a variant of the installation illustrated in FIG. 14, the installation can comprise at least two treatment devices 100a, 100b as described. The references used in FIG. 14 and taken from FIG. 10 represent elements of the same type. The use of several treatment devices makes it possible to perform the treatments in parallel and increase the rate of treatment of the elongate element overall when the treatment of an electronic chip requires the running of the elongate element during said treatment to be slowed down or stopped. According to another example, a first device 100a makes it possible to test a chip of the elongate element and a second device 100b makes it possible to write data on a chip already tested as functional by the device 100a.

The invention claimed is:

1. An installation comprising a treatment device capable of cooperating with an elongate element provided with a plurality of electronic chips staggered along a length of the elongate element,
   wherein the treatment device comprises:
     a housing comprising:
       an input orifice for the elongate element,
       an output orifice for the elongate element, and
       a treatment cavity arranged between the input orifice and the output orifice and provided with a treatment probe for electronic chips,
     and
     an isolation system configured to isolate an electronic chip to be treated and being in the cavity from other electronic chips of the plurality of electronic chips arranged outside the cavity, the isolation system comprising short-circuiting elements configured to come into physical contact with the elongate element on either side of a chip to be treated placed in the cavity,
   wherein the installation further comprises:
     the elongate element comprising the plurality of electronic chips staggered along the length of the elongate element, and
     a system for driving the elongate element to run the elongate element through the housing of the treatment device through the input and output orifices,
   wherein the installation includes a treatment configuration in which an electronic chip to be treated of the elongate element is in the cavity of the housing and in which two electronic chips adjacent to the electronic chip to be treated are arranged outside of the housing.

2. The installation as claimed in claim 1, wherein the treatment probe comprises a radiofrequency antenna configured to interact with the electronic chip to be treated forming a chip of a radio-tag.

3. The installation as claimed in claim 2, wherein the radiofrequency antenna is chosen from among:
   a dipole antenna,
   an antenna with single slot of which the single slot extends along a section of the elongate element present in the cavity of the housing when the elongate element passes through the input orifice and the output orifice,
   an antenna with double slots of which a first slot extends along a section of the elongate element present in the cavity of the housing when the elongate element passes through the input orifice and the output orifice, and of which a second slot is substantially at right angles to the first slot, the first and second slots being included in a same plane and comprising a common part at their intersection,
   a loop antenna.

4. A method for using the installation as claimed in claim 3, comprising:
   providing the elongate element comprising the plurality of electronic chips staggered along the length of the elongate element,
   placing one of the chips of the plurality of electronic chips in the cavity of the treatment device so that two other electronic chips adjacent to the electronic chip placed in the cavity are arranged outside of the housing,
   activating the treatment probe to treat the electronic chip placed in the cavity, so that the treatment probe interacts with the electronic chip placed in the cavity,
   wherein the electronic chip placed in the cavity and the two adjacent electronic chips placed outside of the housing during the placing are electronic chips of radio-tags, and wherein the electronic chip placed in the cavity is linked electrically to one of the adjacent electronic chips by a first electrical link element, and to the other of the adjacent electronic chips by a second electrical link element, the first and second electrical link elements forming an antenna of the electronic chip placed in the cavity, and
   providing interaction of the isolation system with the first and second electrical link elements making it possible to filter, or short-circuit, electromagnetic waves that are propagated along the first and second electrical link elements following the activation of the treatment probe to avoid electrically powering the two adjacent electronic chips by the electromagnetic waves.

5. The installation as claimed in claim 3, wherein the isolation system comprises a first ferrite arranged at the input orifice and a second ferrite arranged at the output orifice.

6. The installation as claimed in claim 3, wherein, in the treatment configuration, the two electronic chips adjacent to the electronic chip to be treated are linked electrically to the chip to be treated by link elements of the elongate element, and wherein the isolation system is configured to act on electromagnetic waves from the treatment probe that are propagated along the link elements linked to the electronic chip to be treated.

7. A method for using the installation as claimed in claim 2, comprising:
   providing the elongate element comprising the plurality of electronic chips staggered along the length of the elongate element,
   placing one of the chips of the plurality of electronic chips in the cavity of the treatment device so that two other electronic chips adjacent to the electronic chip placed in the cavity are arranged outside of the housing, activating the treatment probe to treat the electronic chip placed in the cavity, so that the treatment probe interacts with the electronic chip placed in the cavity, wherein the electronic chip placed in the cavity and the two adjacent electronic chips placed outside of the housing during the placing are electronic chips of radio-tags, and wherein the electronic chip placed in the cavity is linked electrically to one of the adjacent electronic chips by a first electrical link element, and to the other of the adjacent electronic chips by a second electrical link element, the first and second electrical link elements forming an antenna of the electronic chip placed in the cavity, and providing interaction of the isolation system with the first and second electrical link elements making it possible to filter, or short-circuit, electromagnetic waves that are propagated along the first and second electrical link elements following the activation of the treatment probe to avoid electrically powering the two adjacent electronic chips by the electromagnetic waves.

8. The installation as claimed in claim 2, wherein the isolation system comprises a first ferrite arranged at the input orifice and a second ferrite arranged at the output orifice.

9. The installation as claimed in claim 2, wherein, in the treatment configuration, the two electronic chips adjacent to the electronic chip to be treated are linked electrically to the chip to be treated by link elements of the elongate element, and wherein the isolation system is configured to act on electromagnetic waves from the treatment probe that are propagated along the link elements linked to the electronic chip to be treated.

10. The installation as claimed in claim 1, wherein the isolation system comprises a first ferrite arranged at the input orifice and a second ferrite arranged at the output orifice.

11. A method for using the installation as claimed in claim 10, comprising:
providing the elongate element comprising the plurality of electronic chips staggered along the length of the elongate element,
placing one of the chips of the plurality of electronic chips in the cavity of the treatment device so that two other electronic chips adjacent to the electronic chip placed in the cavity are arranged outside of the housing,
activating the treatment probe to treat the electronic chip placed in the cavity, so that the treatment probe interacts with the electronic chip placed in the cavity,
wherein the electronic chip placed in the cavity and the two adjacent electronic chips placed outside of the housing during the placing are electronic chips of radio-tags, and wherein the electronic chip placed in the cavity is linked electrically to one of the adjacent electronic chips by a first electrical link element, and to the other of the adjacent electronic chips by a second electrical link element, the first and second electrical link elements forming an antenna of the electronic chip placed in the cavity, and
providing interaction of the isolation system with the first and second electrical link elements making it possible to filter, or short-circuit, electromagnetic waves that are propagated along the first and second electrical link elements following the activation of the treatment probe to avoid electrically powering the two adjacent electronic chips by the electromagnetic waves.

12. The installation as claimed in claim 1, wherein, in the treatment configuration, the two electronic chips adjacent to the electronic chip to be treated are linked electrically to the chip to be treated by link elements of the elongate element, and wherein the isolation system is configured to act on electromagnetic waves from the treatment probe that are propagated along the link elements linked to the electronic chip to be treated.

13. The installation as claimed in claim 12, wherein, in the treatment configuration, the link elements each pass through a ferrite.

14. The installation as claimed in claim 13, wherein the link elements are in physical contact with short-circuiting elements of the isolation system.

15. The installation as claimed in claim 12, wherein the link elements are in physical contact with short-circuiting elements of the isolation system.

16. A method for using the installation as claimed in claim 1, comprising:
providing the elongate element comprising the plurality of electronic chips staggered along the length of the elongate element,
placing one of the chips of the plurality of electronic chips in the cavity of the treatment device so that two other electronic chips adjacent to the electronic chip placed in the cavity are arranged outside of the housing,
activating the treatment probe to treat the electronic chip placed in the cavity, so that the treatment probe interacts with the electronic chip placed in the cavity,
wherein the electronic chip placed in the cavity and the two adjacent electronic chips placed outside of the housing during the placing are electronic chips of radio-tags, and wherein the electronic chip placed in the cavity is linked electrically to one of the adjacent electronic chips by a first electrical link element, and to the other of the adjacent electronic chips by a second electrical link element, the first and second electrical link elements forming an antenna of the electronic chip placed in the cavity, and
providing interaction of the isolation system with the first and second electrical link elements making it possible to filter, or short-circuit, electromagnetic waves that are propagated along the first and second electrical link elements following the activation of the treatment probe to avoid electrically powering the two adjacent electronic chips by the electromagnetic waves.

17. A treatment device capable of cooperating with an elongate element provided with a plurality of electronic chips staggered along a length of the elongate element, the treatment device comprising:
a housing comprising:
an input orifice for the elongate element,
an output orifice for the elongate element,
a treatment cavity arranged between the input orifice and the output orifice and provided with a treatment probe for electronic chips, and
an isolation system configured to isolate an electronic chip to be treated and being in the cavity from other electronic chips of the plurality of electronic chips arranged outside the cavity, the isolation system comprising short-circuiting elements configured to come into physical contact with the elongate element on either side of a chip to be treated placed in the cavity,
wherein the treatment probe comprising a radiofrequency antenna configured to interact with the electronic chip to be treated forming a chip of a radio-tag, wherein the radiofrequency antenna is chosen from among:
a dipole antenna,
an antenna with single slot of which the single slot extends along a section of the elongate element present in the cavity of the housing when the elongate element passes through the input orifice and the output orifice,
an antenna with double slots of which a first slot extends along a section of the elongate element present in the cavity of the housing when the elongate element passes through the input orifice and the output orifice, and of which a second slot is substantially at right angles to the first slot, the first and second slots being included in a same plane and comprising a common part at their intersection,
a loop antenna.

18. A treatment device capable of cooperating with an elongate element provided with a plurality of electronic chips staggered along a length of the elongate element, the treatment device comprising:

a housing comprising:
  an input orifice for the elongate element,
  an output orifice for the elongate element, and
  a treatment cavity arranged between the input orifice and the output orifice and provided with a treatment probe for electronic chips,
and
an isolation system configured to isolate an electronic chip to be treated and being in the cavity from other electronic chips of the plurality of electronic chips arranged outside the cavity, the isolation system comprising short-circuiting elements configured to come into physical contact with the elongate element on either side of a chip to be treated placed in the cavity,
wherein the isolation system comprises a first ferrite arranged at the input orifice and a second ferrite arranged at the output orifice.

* * * * *